(12) United States Patent
Bass et al.

(10) Patent No.: US 9,413,363 B2
(45) Date of Patent: Aug. 9, 2016

(54) CHARGE PUMP WITH MATCHED CURRENTS

(71) Applicant: SanDisk Technologies Inc., Plano, TX (US)

(72) Inventors: Simon Bass, Beer Sheva (IL); Alexander Tetelbaum, Beer Sheva (IL)

(73) Assignee: SanDisk Technologies LLC, Plano, TX (US)

( * ) Notice: Subject to any disclaimer, the term of this patent is extended or adjusted under 35 U.S.C. 154(b) by 60 days.

(21) Appl. No.: 14/451,966

(22) Filed: Aug. 5, 2014

(65) Prior Publication Data

US 2016/0043636 A1 Feb. 11, 2016

(51) Int. Cl.
*H03L 7/089* (2006.01)
*H02M 3/07* (2006.01)

(52) U.S. Cl.
CPC .............. *H03L 7/0891* (2013.01); *H02M 3/07* (2013.01); *H03L 7/0895* (2013.01); *H03L 7/0896* (2013.01)

(58) Field of Classification Search
CPC ..... H02M 3/07; H03L 7/0891; H03L 7/0893; H03L 7/0895
USPC ........ 327/148, 157, 536; 363/59, 60; 375/374
See application file for complete search history.

(56) References Cited

U.S. PATENT DOCUMENTS 5,945,855 A * 8/1999 Momtaz ................ H03L 7/0896
327/156

| 6,163,187 A * | 12/2000 | Sano ................... G11B 20/1403 |
| | | 307/110 |
| 7,902,888 B1 | 3/2011 | Mei et al. |
| 8,193,843 B1 * | 6/2012 | Stegmeir ............... H03L 7/0895 |
| | | 327/148 |
| 2006/0125535 A1 | 6/2006 | Caplan et al. |
| 2008/0101521 A1 * | 5/2008 | Lee ....................... H03L 7/0898 |
| | | 375/371 |
| 2010/0141491 A1 * | 6/2010 | Caplan .................. H03L 7/0895 |
| | | 341/118 |
| 2015/0200589 A1 * | 7/2015 | Lee ....................... H03L 7/0896 |
| | | 327/157 |

OTHER PUBLICATIONS

Fazeel et al., "Reduction of Current Mismatch in PLL Charge Pump," Computer Society Annual Symposium on VLSI, 2009, IEEE, pp. 7-12.

Liu et al., "All Digital Dynamic Self-Detection and Self-Compensation of Static Phase Offsets in Charge-Pump PLLs," 2007, IEEE International Solid-State Circuits Conference, Session 9, Clocking, 9.3, pp. 176-178.

* cited by examiner

*Primary Examiner* — William Hernandez

(74) *Attorney, Agent, or Firm* — Davis Wright Tremaine LLP

(57) ABSTRACT

A charge pump provides matched charging and discharging currents. One transistor is connected to an input of a charge pump core while two transistors are connected to the other input of the charge pump core, with each of the transistors mirroring a reference transistor through different mirroring pathways so that current through the transistor of the first input is equal to the sum of currents through the two transistors of the second input.

18 Claims, 7 Drawing Sheets

CHARGE PUMP WITH MATCHED CURRENTS

BACKGROUND OF THE INVENTION

This invention relates generally to charge pumps, their design and operation, and to use of such charge pumps in circuits including Phase Locked Loops (PLLs).

Charge pumps are used in a variety of integrated circuits for a variety of purposes. For example, certain PLLs use a charge pumps stage. PLLs are used in a variety of applications in various integrated circuits including memory systems, controllers, programmable logic systems, and others.

FIG. 1 illustrates phase-locked loop (PLL) circuitry, according to the prior art. A phase-frequency detector (PFD) generates an input to a charge pump (CP). The input consists of an up signal ("UP") and a down signal ("DN") in this example. This output is generated by comparing the phase difference of a reference signal ("Ref_clk") to a feedback signal ("Fbk_clk"). The PFD outputs the up signal and the down signal depending on whether or not the phase of the feedback signal lags (needs to speed up) or leads (needs to slow down) when compared to the input signal. The charge pump generates current pulses in a charge pump output signal (e.g., to charge capacitors in loop filter circuitry) based on the up signal and the down signal.

The loop filter circuitry filters the charge pump output signal and generates a filtered control signal. Voltage controlled oscillator (VCO) generates an output signal whose frequency (Fout) is determined by the voltage of the filtered charge pump output. The PLL loops the output signal back to the PFD. A frequency divider circuitry may be placed in the feedback path of the loop to allow the output signal to be a multiple of the input signal (this is optional).

FIG. 2 shows a simplified schematic of a charge pump such as the charge pump of FIG. 1. Two inputs, "UP" and "DN" are received from the PFD and drive up and down switches respectively to connect an output node to one of two current sources, an up-current source (providing current Iup) and a down-current source (providing current Idn), which charge and discharge the output node respectively. The charge pump generates an output from the output node which lies between the up switch and the down switch. The up and down switches that provide the output from the UP and DN signals may be considered to be the charge pump core (indicated by the dashed line in FIG. 2).

In one mode, the UP and DN signals direct the up switch to open and the down switch to close. Because the down switch is closed, the down-current source is electrically connected to the output node through a low-resistance path and removes charge from the output node so that the output voltage drops. This may be considered a discharging mode of the charge pump core. In another mode, the UP and DN signals direct the up switch to close and the down switch to open. Because the up switch is closed, the up-current source is electrically connected do the output node through a low-resistance path and adds charge to the output node so that the output voltage increases. This may be considered a charging mode of the charge pump core.

One non-ideal charge pump characteristic that may occur is current mis-matching. For proper operation of a charge pump, the current that is produced by the up-current source, Iup, should exactly match the current that is produced by the down-current source, Idn, for all conditions. If these currents are not always equal, the charge on the output node and therefore the voltage on the output node will either rise faster or slower than expected, leading to non-linear behavior such as phase error and/or jitter.

Thus, there is a need for a charge pump that provides matched charging and discharging currents to a charge pump core throughout a range of conditions.

SUMMARY OF THE INVENTION

According to an example, a charge pump stage provides matched charging and discharging currents. One transistor is connected to an input of a charge pump core while two transistors are connected to the other input of the charge pump core, with each of the transistors mirroring a reference transistor through different mirroring pathways so that current through the transistor of the first input is equal to current through the two transistors of the second input.

An example of a charge pump stage includes: a charging and discharging charge pump core; a first transistor connected to a first input of the charging and discharging charge pump core; a second transistor connected to a second input of the charging and discharging charge pump core; a third transistor connected to the second input of the charging and discharging charge pump core; and a current mirroring circuit that controls the first transistor, the second transistor, and the third transistor according to a reference current to provide currents having substantially equal magnitude at the first input of the charge pump core and at the second input of the charge pump core.

The first transistor may be a PMOS transistor, the second transistor may be an NMOS transistor, and the third transistor may be an NMOS transistor. The second transistor and the third transistor may be connected in parallel between the second input and a common terminal, and gates of the first and second transistors may be coupled to a reference transistor via different pathways so that currents in the second and third transistors mirror the reference current in the reference transistor. The reference transistor may be an NMOS transistor and at least one of the different pathways may extend through PMOS transistors. The first transistor may be connected between the first input and a supply terminal, and the first transistor may have a gate that is coupled to the reference transistor so that current in the third transistor mirrors the reference current in the reference transistor. The voltage difference between the supply terminal and the common terminal may be between 0.8 volts and 1.0 volts. The charge pump core may comprise a pull-up transistor that connects a charge pump output to the first input and a pull-down transistor that connects the charge pump output to the second input.

An example of a Phase Locked Loop (PLL) circuit includes: a Voltage Controlled Oscillator (VCO) that provides a feedback output; a Phase Frequency Detector (PFD) that receives the feedback output and generates a detector output from the feedback output and a reference signal; a Charge Pump (CP) that receives the detector output and generates an output to the VCO from the detector output, the CP comprising: a charging and discharging charge pump core; a first transistor connected between a first input of the charging and discharging charge pump core and a first charge pump terminal; a second transistor connected between a second input of the charging and discharging charge pump core and a second charge pump terminal; a third transistor connected between the second input of the charging and discharging charge pump core and the second charge pump terminal; and a current mirroring circuit that controls the first transistor, the second transistor, and the third transistor according to a reference current to provide currents having substantially equal magnitude at the first input of the charge pump core and at the second input of the charge pump core.

The current mirroring circuit may include an NMOS reference transistor, the second and third transistors may be NMOS transistors, and the gate of the reference transistor may be directly connected to the gate of the second transistor in a current-mirror arrangement. The first transistor may be a PMOS transistor, the gate of the reference transistor may be directly connected to the gate of a fourth transistor that is an NMOS transistor connected in series with a fifth transistor that is a PMOS transistor, and the gate of the fifth transistor may be directly connected to the gate of the first transistor in a current-mirror arrangement. The gate of a sixth transistor, that is a PMOS transistor, may be directly connected to the gate of the fifth transistor, the sixth transistor connected in series with a seventh transistor that is an NMOS transistor, the gate of the seventh transistor directly connected to the gate of the third transistor. The charging and discharging charge pump core may comprise: a first branch extending between the first input and the second input, the first branch having a first pull-up transistor in series with first pull-down transistor and a first node between the first pull-up transistor and the first pull-down transistor; a second branch extending between the first input and the second input, the second branch having a second pull-up transistor in series with a second pull-down transistor and a second node between the second pull-up transistor and the second pull-down transistor; and a unity gain buffer amplifier connected between the first node and the second node. The charging and discharging charge pump core may also include: a capacitor connected between the output of the unity gain buffer amplifier and ground; and a direct connection from the first node to the output to the VCO.

An example of a method of obtaining current matching in a charge pump includes: connecting a first current supply transistor between a first input of a charging and discharging charge pump core and a first supply voltage; connecting a second current supply transistor in parallel with a third current supply transistor between a second input of the charging and discharging charge pump core and a second supply voltage; connecting a first current mirroring circuit to the first current supply transistor so that current in the first current supply transistor mirrors current in a reference transistor; connecting a second current mirroring circuit to the second current supply transistor so that current in the second current supply transistor mirrors current in the reference transistor; and connecting a third current mirroring circuit to the third current supply transistor so that current in the third current supply transistor mirrors current in the reference transistor.

The first, second, and third current supply transistors may mirror the current in the reference transistor such that the sum of the currents in the second and third current supply transistors is equal in magnitude to the current in the first current supply transistor. The first current supply transistor may be a PMOS transistor, the second and third current supply transistors may be NMOS transistors, and the second current mirroring circuit may include at least one PMOS transistor. The third current mirroring circuit may include a direct connection between gates of the third current supply transistor and the reference transistor.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF EXEMPLARY EMBODIMENTS

Figure 1:
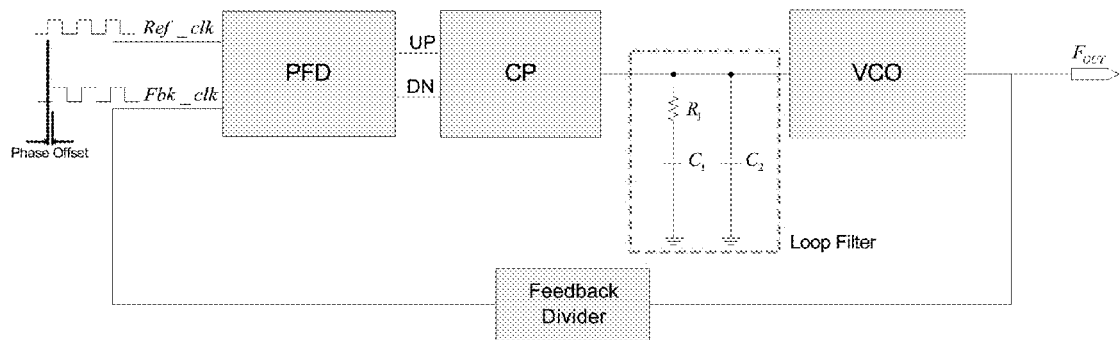
FIG. 1 is a block diagram of a prior art PLL.

Charge pumps have a wide range of applications including in PLLs and other circuits. Charge pumps, in PLLs or other circuits, may be used in various integrated circuits (ICs) including memory systems, controller systems, communication systems including mobile communication systems, programmable logic systems.

Memory System

Charge pumps may be used in various applications in memory systems. For example, PLLs may be used in some memory systems to deskew data sent over data busses. This may be a concern in a variety of memory systems including multi-chip memory systems such as solid state drives (SSDs) which may have long data paths of differing geometries. PLLs may be used to generate high frequencies with low jitter for communication systems including those found in memory systems.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Charge Pump

Figure 3A:
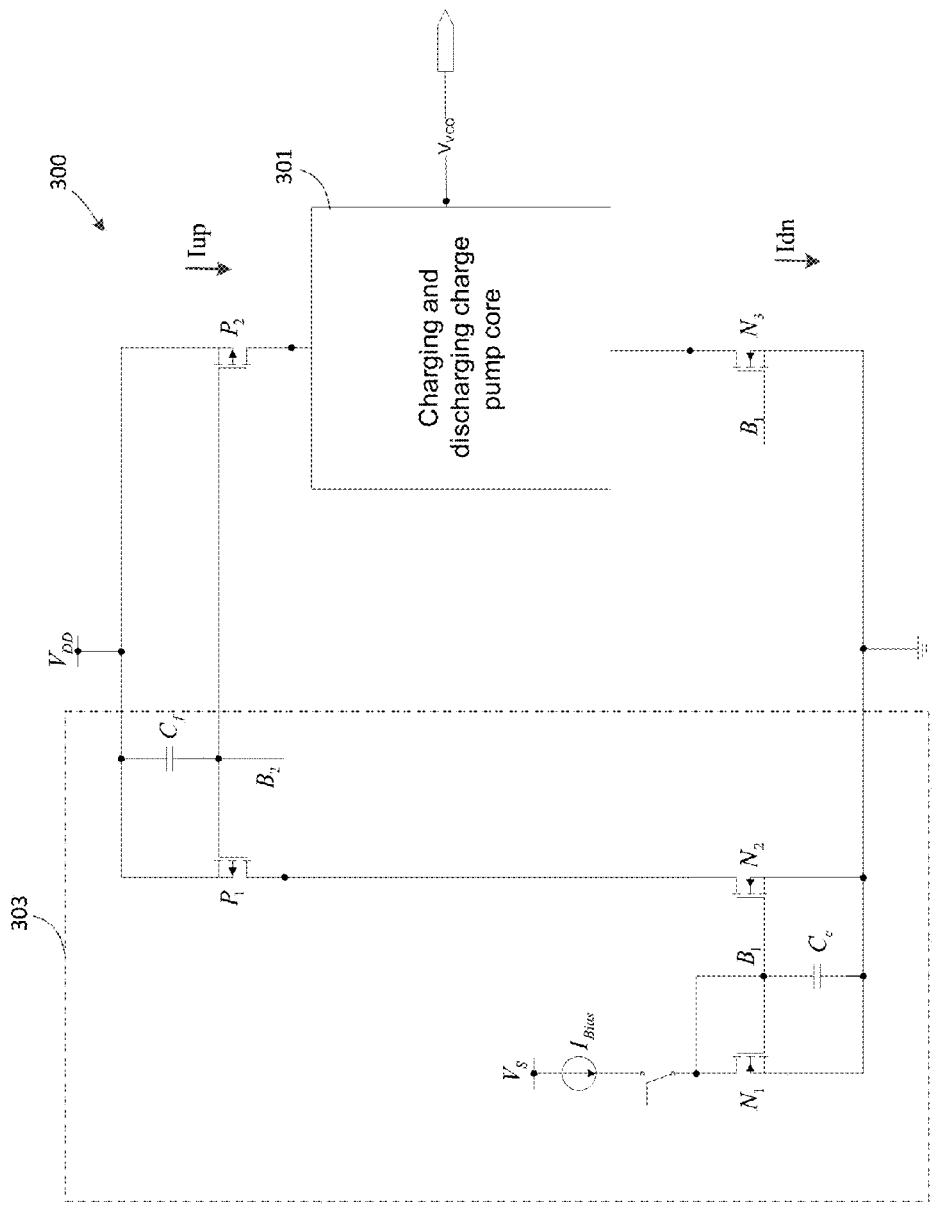
FIG. 3A shows a charge pump with current mirroring.

An example of a charge pump 300 is shown in FIG. 3A. FIG. 3A shows a first input of a charge pump core 301 connected to a supply voltage (in this case $V_{DD}$) through a first current input transistor, which in this example is a PMOS transistor P2. A second input of charge pump core 301 is connected to a second supply voltage (in this case ground) through a second current input transistor, in this case an NMOS transistor N3. First and second current input transistors P2 and N3 are controlled by a current mirroring circuit 303 so that charging and discharging currents Iup and Idn both mirror a reference current. In this case, a reference current is provided through a reference transistor, NMOS transistor N1. The gate of reference transistor N1 is directly connected to the gate of second current input transistor N3, through node B1, in a direct current mirror arrangement. The gate of reference current transistor N1 is also connected to the gate of NMOS transistor N2 so that the current in transistor N2 directly mirrors the reference current. Transistor N2 is connected in series with PMOS transistor P1 so that the current through transistors P1 and N2 are equal. The gate of PMOS transistor P1 is directly connected to the gate of first current input transistor P2 so that the current in PMOS transistor mirrors the current in transistor P1. Thus, indirectly, the current in first current input transistor P2 mirrors the current in reference transistor N1.

Figure 2:
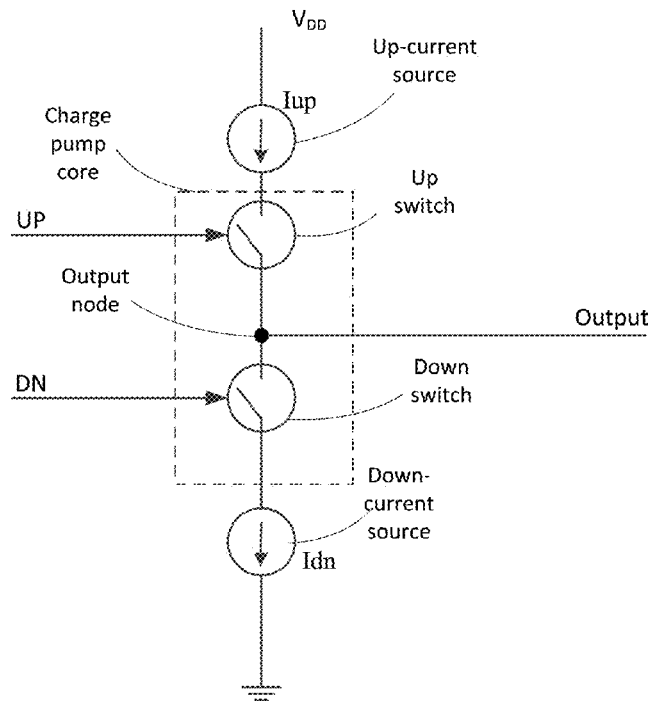
FIG. 2 is a schematic illustration of a prior art charge pump.
Figure 3B:
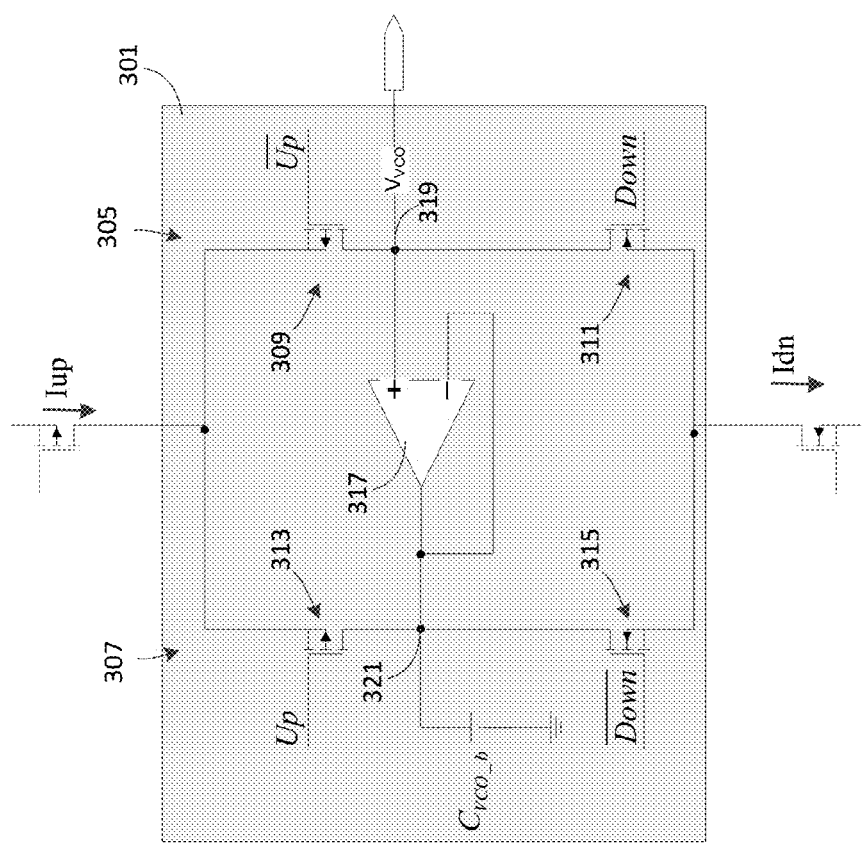
FIG. 3B illustrates an example of a charging and discharging charge pump core.

FIG. 3B shows an example of a charge pump core 301 that is connected so that an output is provided to a VCO ($V_{VCO}$). In this example, the charge pump core 301 includes two branches that each extend from the first (top) input to the second (bottom) input. The right-hand branch 305 contains two transistors 309, 311 connected in series to perform the same functions as the up switch and down switch of FIG. 2. The left-hand branch 307 also contains two transistors 313, 315 which are used to compensate for charge sharing effects. The upper transistors 309, 313 are PMOS transistors that are on when they receive a low voltage and turn off when they receive a high voltage. The lower transistors 311, 315 are NMOS transistors that are off when they receive a low voltage and turn on when they receive a high voltage. Thus, in the right-hand branch 305, when UP is high, UP is low which causes PMOS transistor 309 to turn on. When DN is high this causes NMOS transistor 311 to turn on. A unity gain buffer amplifier 317 is connected between the output node 319 in the middle of the right-hand branch 305 and node 321 between the transistors of the left hand branch 307. While the charging and discharging charge pump core 301 is one example of a charge pump core other implementations are also possible and aspects of the present invention are not limited to a particular charging and discharging charge pump core circuit.

While the charge pump of FIG. 3A may provide good performance under some conditions, in some conditions charge pump 300 may suffer from current mismatch. In particular, while both the first current input transistor P2 and second current input transistor N3 mirror the reference transistor, they do so through very different mirroring pathways. The second current input transistor N3 directly mirrors the reference transistor N1 because gates of these two NMOS transistors are directly connected via node B1. In contrast, the first current input transistor, PMOS transistor P2, mirrors the reference transistor N1 indirectly through intermediate transistors including NMOS transistor N2 and PMOS transistor P1. Thus, as temperature, supply voltage and other factors change, these different pathways tend to produce different currents in the first current input transistor P2 and second current input transistor N3. Different currents may also be produced by process variation and mismatch between transistors. Accordingly, some current mismatch may occur (i.e. some difference may develop between Iup and Idn) so that the current matching circuit of FIG. 3 may not be ideal over a wide range of conditions. Any such current mismatch in the charge pump can cause static phase offset. Ripple at the VCO control voltage input due to this phase offset may contribute to reference spurs in PLL output and may therefore increase the period jitter.

Figure 4:
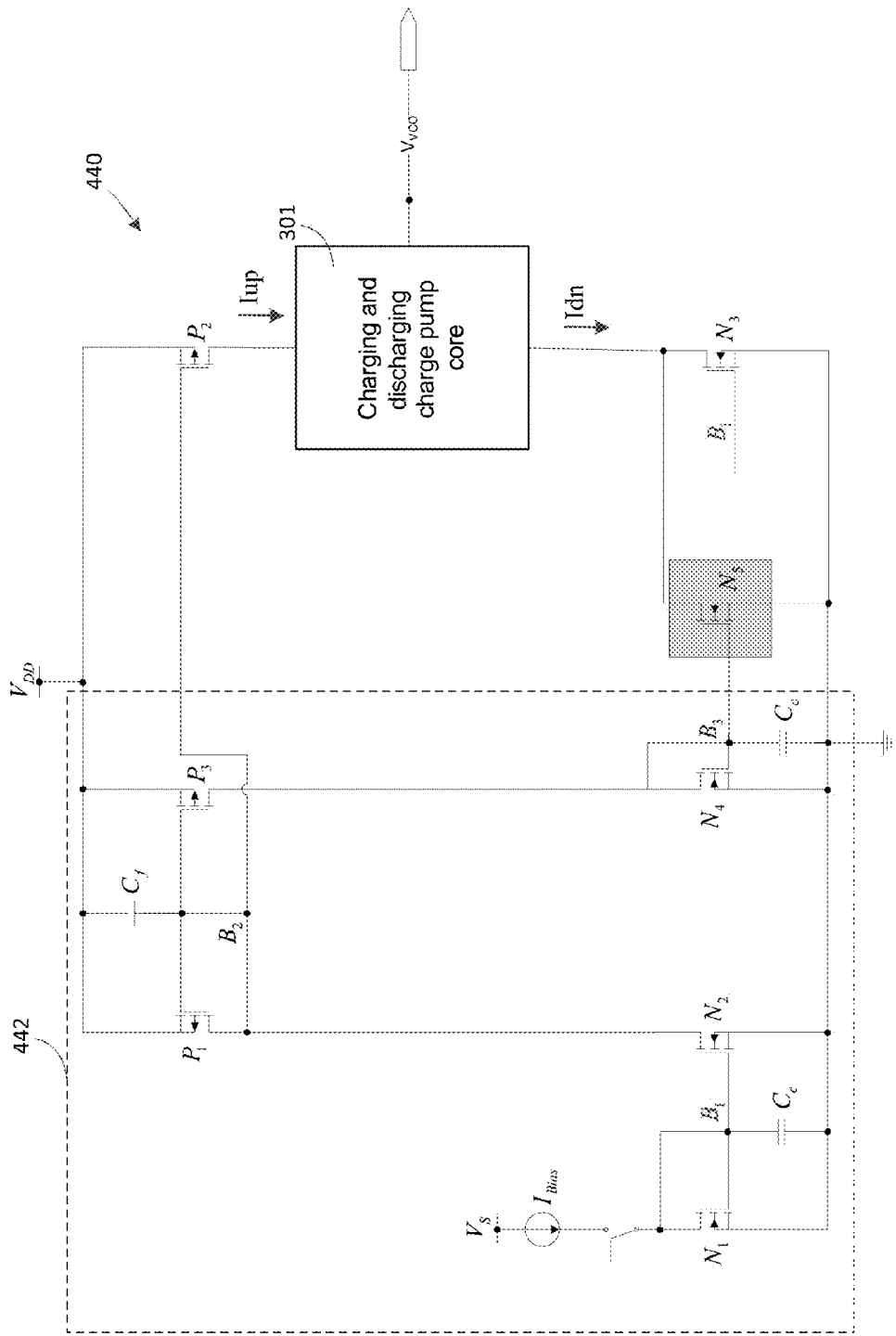
FIG. 4 shows an example of a charge pump with current mirroring to provide good current matching.

FIG. 4 shows an example of a charge pump 440 incorporating aspects of the present invention. FIG. 4 shows a charge pump core 301 and first and second current input transistors P2 and N3 as in FIG. 3. In contrast to the example of FIG. 3, FIG. 4 shows a third current input transistor, NMOS transistor N5, which is connected in parallel with second input transistor N3. Transistors N3 and N5 both extend between the second input of the charge pump core and ground. Thus, the second input current (the discharging current Idn in this example) is the sum of the currents through transistors N3 and N5.

In addition to having two current input transistors N3 and N5 connected to a single input of the charge pump core, FIG. 4 shows a mirroring circuit 442 that is adapted to control the three current input transistors P2, N3, and N5 in a manner that provides little or no current mismatch over a wide range of conditions. While the first current input transistor P2 and second current input transistor N3 are connected as in FIG. 3 so that they mirror the reference current in reference transistor N1, the third current input transistor N5 has additional mirroring circuitry to provide a mirrored reference current with reduced current mismatch.

Figure 5:
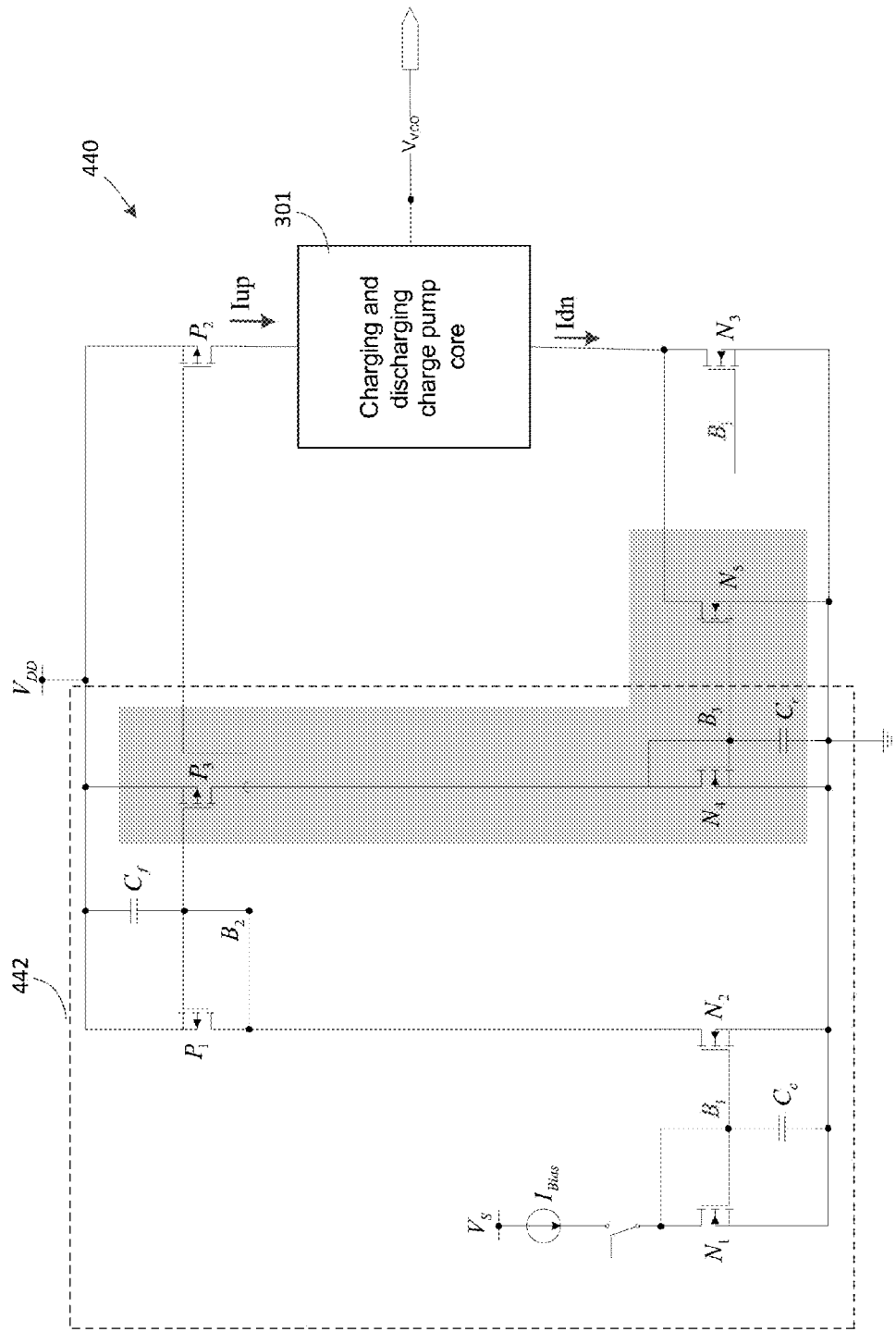
FIG. 5 illustrates particular components of the charge pump of FIG. 4.

FIG. 5 shows the charge pump of FIG. 4 with additional mirroring circuitry (not in FIG. 3) that is associated with the third current input transistor N5 shown by shading. The third current input transistor N5 and some of the current mirroring circuitry associated with its operation are added in this circuit so that current through N5 mirrors current in reference transistor N1. While transistors N3 and N5 are connected in parallel between the charge pump core and ground (i.e. their sources and drains are connected together) their gates are connected differently so that they mirror the reference current through different pathways. It will be understood that in this context "mirroring" a reference current does not require producing a current that is equal to the reference current (though this is one example). The reference current may be mirrored by producing a current that is some multiple of the reference current and thus changes as the reference current changes (e.g. 3 times the reference current, or 0.5 times the reference current). The ratio of the reference current to the current provided by mirroring circuitry may be established by dimensions of the transistors (e.g. dimensions of N1 and N5). In the example of FIG. 5, the mirroring circuit is configured so that N3 and N5 have a combined current that is equal to the current through P2. For example if current through P2 mirrors the reference current through N1 identically (i.e. currents through N1 and P2 are equal) then N3 and N5 may each individually mirror half the reference current so that in combination they mirror the reference current identically.

Figure 6:
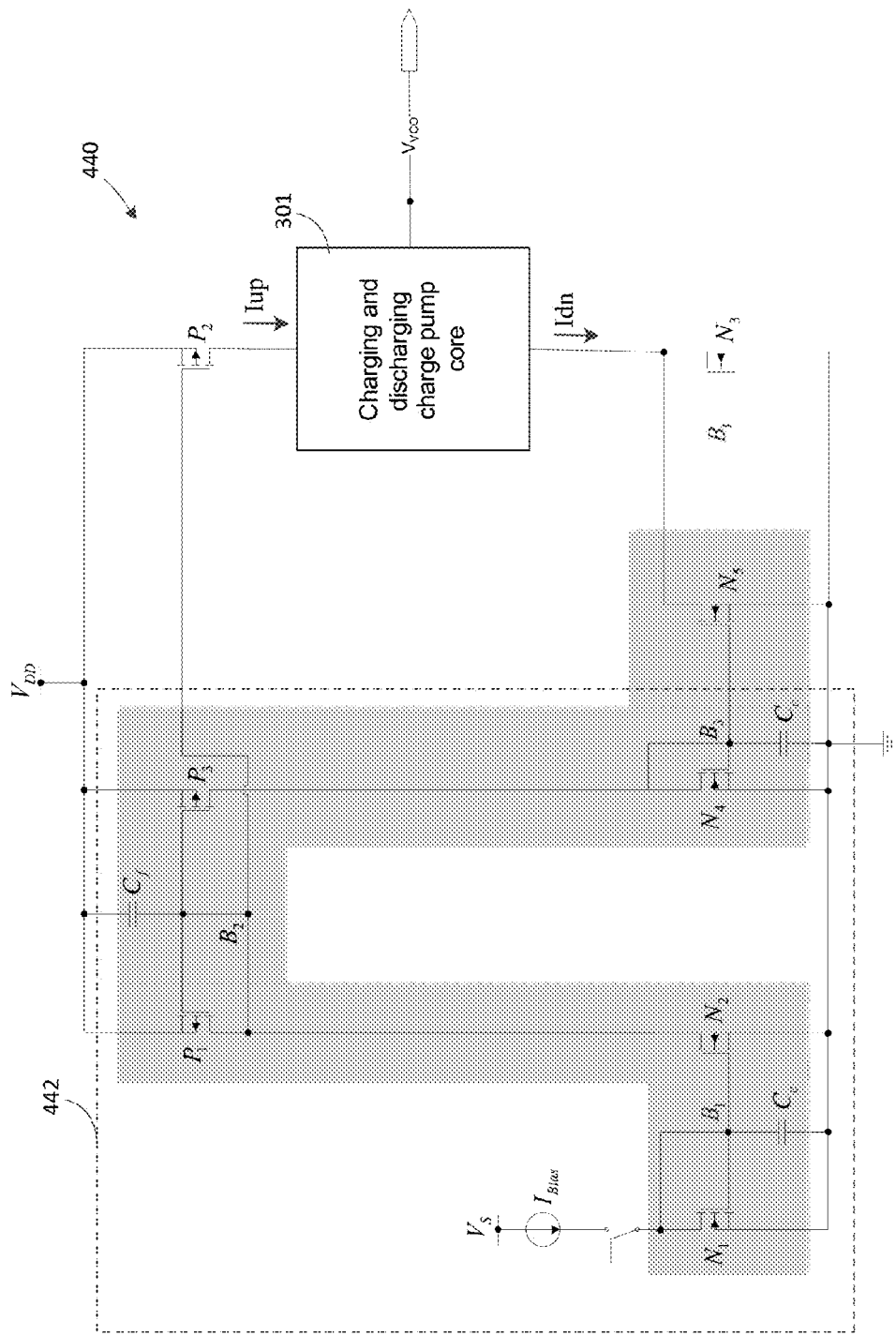
FIG. 6 illustrates a current mirroring path that extends through NMOS and PMOS transistors in the charge pump of FIG. 4.

FIG. 6 illustrates the pathway through which third current input transistor N5 mirrors the reference current through reference transistor N1 (pathway shaded). The gate of third current input transistor N5 is connected to the gate of NMOS transistor N4 in a current mirror arrangement so that the current through transistor N5 is equal to the current through transistor N4. Transistor N4 is connected in series with PMOS transistor P3 so that the current through transistor N4 is equal to the current through transistor P3. The gate of transistor P3 is directly connected to the gate of transistor P1 so that the current through transistor P3 is equal to the current through transistor P1. As previously discussed with respect to FIG. 3, the gate of transistor P2 is also directly connected to the gate of transistor P1 and mirrors the current through transistor P1 (which in turn is connected in series with NMOS transistor N2, which directly mirrors reference transistor N1). Thus, the pathway shown for mirroring the reference current in NMOS transistor N5 shares many components with the pathway used for mirroring the reference current in first current input transistor P2. These shared elements tend to provide similar mirroring in transistors P2 and N5 over different conditions. In particular, because current mirroring pathways for both first current supply transistor P2 (through transistors N2 and P1) and the third current supply transistor N5 (through transistors N2, P1, and N4) both go through both NMOS and PMOS transistors, differences caused by differing characteristics of NMOS and PMOS devices over different conditions are reduced. It will be understood that Idn depends on the current through third current input transistor N5 (plus current through second current input transistor N3) and that reduced mismatch between Idn and Iup may be achieved by matching third current input transistor N5 and first current input transistor P2. In an example, currents through second current input transistor N3 and third current input transistor N5 are equal (i.e. both are Idn/2).

Figure 7:
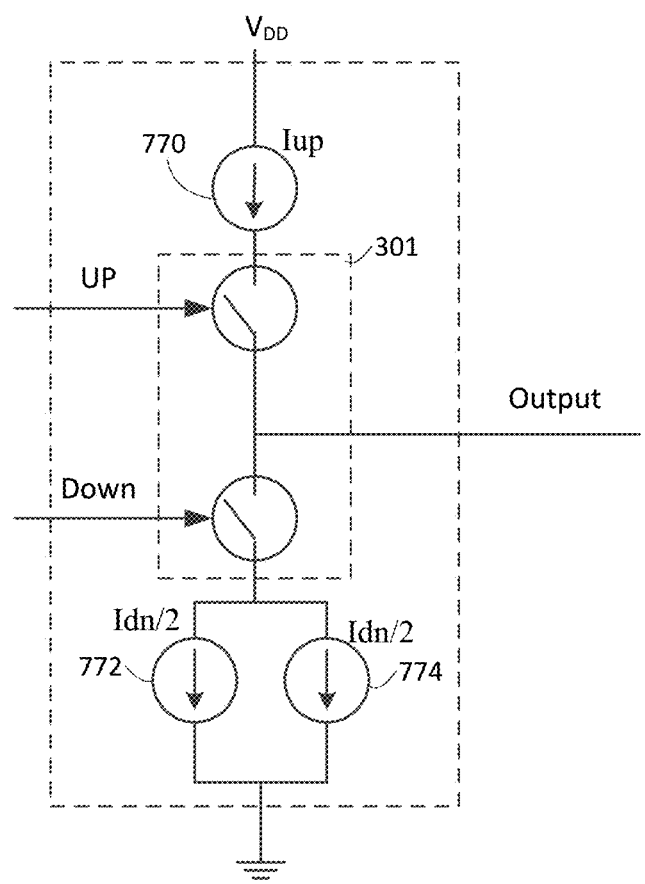
FIG. 7 is a schematic illustration of the charge pump of FIG. 4.

FIG. 7 is a schematic illustration of the circuit described above. While a charging current Iup is provided by a single current supply 770 (a single PMOS transistor P2 in the examples above), the discharging current Idn is provided by two different current supplies 772, 774 (two NMOS transistors N3 and N5, each mirroring a reference transistor through different pathways in the examples above). Each current supply provides Idn/2 so that the sum of the two currents is Idn. It will be understood that the examples above are for illustration of certain aspects of the present invention and that the invention is not limited to the specific examples shown. For example, while FIG. 7 shows two current supplies for discharge current and one current supply for charging current, another example uses two current supplies for a charging current and one for discharging current. For example, two PMOS transistors may be connected between a supply voltage (e.g. VDD) and a charging input of a charge pump core, and one NMOS transistor may be connected between a discharging input of the charge pump core and another supply voltage (e.g. ground). The two PMOS transistors may be controlled through different current mirroring pathways so that, in combination, they supply a charging current that is equal to the discharge current through the NMOS transistor. Other examples are also possible within the scope of the present invention including providing a reference current in a different manner (e.g. using a PMOS reference transistor, and/or connecting the reference transistor in a different manner).

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

The invention claimed is:

1. An apparatus comprising:
a charge pump core configured to charge and discharge;
a first transistor connected to a first input of the charge pump core;
a second transistor connected to a second input of the charge pump core;
a third transistor connected to the second input of the charge pump core in parallel with the second transistor; and
a current mirroring circuit that controls the first transistor, the second transistor, and the third transistor according to a reference current to provide currents having substantially equal magnitude at the first input of the charge pump core and at the second input of the charge pump core.

2. The apparatus of claim 1 wherein the first transistor is a PMOS transistor, the second transistor is an NMOS transistor, and the third transistor is an NMOS transistor.

3. The apparatus of claim 1 wherein the first transistor is an NMOS transistor, the second transistor is a PMOS transistor, and the third transistor is a PMOS transistor.

4. The apparatus of claim 2 wherein the second transistor and the third transistor are connected between the second input and a common terminal, and wherein gates of the first and second transistors are coupled to a reference transistor via different pathways so that currents in the second and third transistors mirror the reference current in the reference transistor.

5. The apparatus of claim 4 wherein the reference transistor is an NMOS transistor and at least one of the different pathways extends through PMOS transistors.

6. The apparatus of claim 5 wherein the first transistor is connected between the first input and a supply terminal, and wherein the first transistor has a gate that is coupled to the reference transistor so that current in the third transistor mirrors the reference current in the reference transistor.

7. The apparatus of claim 6 wherein a voltage difference between the supply terminal and the common terminal is between 0.8 volts and 1.0 volts.

8. The apparatus of claim 1 wherein the charge pump core comprises a pull-up transistor that connects a charge pump output to the first input and a pull-down transistor that connects the charge pump output to the second input.

9. A system comprising:
a Voltage Controlled Oscillator (VCO) that provides a feedback output;
a Phase Frequency Detector (PFD) that receives the feedback output and generates a detector output from the feedback output and a reference signal;
a Charge Pump (CP) that receives the detector output and generates an output to the VCO from the detector output, the CP comprising:
a charge pump core configured to charge and discharge;
a first transistor connected between a first input of the charge pump core and a first charge pump terminal;
a second transistor connected between a second input of the charge pump core and a second charge pump terminal;
a third transistor connected in parallel with the second transistor between the second input of the charge pump core and the second charge pump terminal; and
a current mirroring circuit that controls the first transistor, the second transistor, and the third transistor according to a reference current to provide currents having substantially equal magnitude at the first input of the charge pump core and at the second input of the charge pump core.

10. The system of claim 9 wherein the current mirroring circuit includes an NMOS reference transistor, the second and third transistors are NMOS transistors, and the gate of the reference transistor is directly connected to the gate of the second transistor in a current-mirror arrangement.

11. The system of claim 10 wherein the first transistor is a PMOS transistor, the gate of the reference transistor is directly connected to the gate of a fourth transistor that is an NMOS transistor connected in series with a fifth transistor that is a PMOS transistor, and the gate of the fifth transistor is directly connected to the gate of the first transistor in a current-mirror arrangement.

12. The system of claim 11 further comprising a sixth transistor that is a PMOS transistor, the gate of the sixth transistor directly connected to the gate of the fifth transistor, the sixth transistor connected in series with a seventh transistor that is an NMOS transistor, the gate of the seventh transistor directly connected to the gate of the third transistor.

13. The system of claim 9 wherein the charging and discharging charge pump core comprises:
a first branch extending between the first input and the second input, the first branch having a first pull-up transistor in series with a first pull-down transistor and a first node between the first pull-up transistor and the first pull-down transistor;

a second branch extending between the first input and the second input, the second branch having a second pull-up transistor in series with a second pull-down transistor and a second node between the second pull-up transistor and the second pull-down transistor; and a unity gain buffer amplifier connected between the first node and the second node.

14. The system of claim 13 wherein the charging and discharging charge pump core further comprises:

a capacitor connected between the output of the unity gain buffer amplifier and ground; and a direct connection from the first node to the output of the VCO.

15. A method of obtaining current matching in a charge pump comprising:

connecting a first current supply transistor between a first input of a charging and discharging charge pump core and a first supply voltage;

connecting a second current supply transistor in parallel with a third current supply transistor between a second input of the charging and discharging charge pump core and a second supply voltage;

connecting a first current mirroring circuit to the first current supply transistor so that current in the first current supply transistor mirrors current in a reference transistor;

connecting a second current mirroring circuit to the second current supply transistor so that current in the second current supply transistor mirrors current in the reference transistor; and connecting a third current mirroring circuit to the third current supply transistor so that current in the third current supply transistor mirrors current in the reference transistor.

16. The method of claim 15 wherein the first, second, and third current supply transistors mirror the current in the reference transistor such that the sum of the currents in the second and third current supply transistors is equal in magnitude to the current in the first current supply transistor.

17. The method of claim 16 wherein the first current supply transistor is a PMOS transistor, the second and third current supply transistors are NMOS transistors, and the second current mirroring circuit includes at least one PMOS transistor.

18. The method of claim 17 wherein the third current mirroring circuit includes a direct connection between gates of the third current supply transistor and the reference transistor.

* * * * *